US 6,603,705 B2

(12) United States Patent
Chen et al.

(10) Patent No.: US 6,603,705 B2
(45) Date of Patent: Aug. 5, 2003

(54) METHOD OF ALLOWING RANDOM ACCESS TO RAMBUS DRAM FOR SHORT BURST OF DATA

(75) Inventors: Jason Chen, Ottawa (CA); Henry Chow, Kanata (CA); Mark William Janoska, Carleton Place (CA)

(73) Assignee: PMC-Sierra Ltd., Burnaby (CA)

( * ) Notice: Subject to any disclaimer, the term of this patent is extended or adjusted under 35 U.S.C. 154(b) by 86 days.

(21) Appl. No.: 09/969,597

(22) Filed: Oct. 4, 2001

(65) Prior Publication Data

US 2002/0089882 A1 Jul. 11, 2002

Related U.S. Application Data

(60) Provisional application No. 60/238,036, filed on Oct. 6, 2000.

(51) Int. Cl.[7] .................................................. G11C 8/18
(52) U.S. Cl. .................... 365/233; 365/230.03; 365/194
(58) Field of Search ............................ 365/230.03, 233, 365/194, 195

(56) References Cited

U.S. PATENT DOCUMENTS

| | | | |
|---|---|---|---|
| 5,153,856 A | 10/1992 | Takahashi | 365/233 |
| 5,479,636 A | 12/1995 | Vanka et al. | 711/133 |
| 5,561,783 A | 10/1996 | Vanka et al. | 711/141 |
| 5,778,446 A | 7/1998 | Kim | 711/167 |
| 5,893,158 A | 4/1999 | Furuta | 711/150 |
| 6,052,780 A | 4/2000 | Glover | 711/119 |
| 6,125,422 A | 9/2000 | May | 711/5 |
| 6,144,598 A * | 11/2000 | Cooper et al. | 365/201 |
| 6,154,821 A | 11/2000 | Barth et al. | 711/170 |
| 6,219,765 B1 * | 4/2001 | Jeddeloh | 711/154 |

OTHER PUBLICATIONS

US 5,978,887, 11/1999, Yeager (withdrawn)
Rambus DRAM for OC192 Data Rate Line Card Applications—pp. 1–9, Mar. 2000.

* cited by examiner

*Primary Examiner*—Andrew Q. Tran
(74) *Attorney, Agent, or Firm*—Shapiro Cohen

(57) ABSTRACT

Methods and devices for arranging memory access operations to minimize memory bank conflicts between such operations. A fixed pattern of memory access operations is implemented to minimize the effects of a transition between a read memory access operation and a write memory access operation. A write-read-gap (WRG) set pattern of a write memory access operation followed by a read memory access operation and then followed by a set gap when no memory access operation may be undertaken, meets the particular requirements of RDRAM. Within the WRG pattern, read addresses and write addresses are selected to minimize memory bank access conflicts. Such selections are assisted in increasing the efficiency of the memory access operations by defining a set frame size of a specific number of repetitions of the WRG pattern. All memory access operations are then rearranged to conform to the WRG pattern and, the repetitions of the WRG pattern are divided into frames having a size equal to that of the defined frame size. Within each frame, the read addresses to be accessed by read memory operations can be rearranged to minimize memory bank access conflicts with either write addresses to be accessed by write memory operations or other read addresses.

6 Claims, 2 Drawing Sheets

METHOD OF ALLOWING RANDOM ACCESS TO RAMBUS DRAM FOR SHORT BURST OF DATA

The present invention relates to U.S. Provisional Patent Application No. 60/238,036 filed Oct. 6, 2000.

FIELD OF INVENTION

The present invention relates to computer memories and, more specifically to methods and devices for adapting computer memories to computer network applications.

BACKGROUND TO THE INVENTION

Computer memories have been used in computers since computers were first invented. The advent of networks of computers has provided another field in which computer memories can be used. The increasing rates of data influx in networks has underlined the difference between how computers and networks use computer memories. Previously, high speed yet costly SRAM (Static Random Access Memories) were used in buffers in computer network elements to help the networks cope with fast input and throughput of data in networks. In recent years cheap yet faster and faster DRAMs (dynamic random access memory) have taken some of the duties of the SRAM. Because of its cost, this DRAM type of computer memory is, currently the most widely used type of computer memory in regular computers. However, as noted above, computers and network devices use computer memory in different ways.

While regular computers and network devices try to take advantage of the large storage capacities and fast access times offered by DRAMs, the patterns of use of computer memories is different. For computing applications, long, variable bursts of data are not uncommon. Furthermore, the amount of data accessed in read/write memory access operations and the ratio between read memory access operations and write memory access operations is dependent on the actual computer application. Also, computer applications may require that computer memories be able to transfer large amounts of data in a short amount of time even though normal computer applications generally only use moderate amounts of data flow. And lastly, data delay, or the delay between bursts of data, is not a high priority for computer applications.

In contrast to the above, networking applications, as implemented in network devices, have very different requirements. Networking applications generally require short, fixed length blocks of data from the computer memories. The amount of data per unit time that computer memories have to deliver is dictated by datapath speeds and there are usually equal numbers of read and write memory access operations. Furthermore, networking applications require that a guaranteed amount of data be delivered in a given time to maintain datapaths. In terms of data delays, delays must be predictable and minimizing such delays is highly desirable.

One major development in the field of DRAMs is the emergence of the RDRAM (Rambus™ Direct Dynamic Random Access Memory) device. While the RDRAM does have some characteristics which would be highly desirable for networking applications, such as high storage density, high data transfer capabilities and low amounts of delay on transitions between read operations and write operations, the RDRAM is generally considered as being optimized for computer applications. Like most DRAMs, the RDRAM is generally most efficient when dealing with long bursts of data from consecutive memory locations. To this end, sense amplifiers, used to transfer data to and from data banks in a RDRAM, are shared between memory banks. This design choice allows large chunks of data to be read out but also prevents an accessed bank, and any banks adjacent to the accessed bank, from being accessed for a given amount of time. Thus, if Bank A is accessed, that bank and any banks adjacent to it cannot be accessed for a time period that may be as long as the time it takes for three memory access operations.

This drawback of RDRAMs needs to be overcome so that the benefits of RDRAM can be harnessed for networking applications.

SUMMARY OF THE INVENTION

The present invention seeks to meet the above need by providing methods and devices for arranging memory access operations to minimize memory bank conflicts between such operations. A fixed pattern of memory access operations is implemented to minimize the effects of a transition between a read memory access operation and a write memory access operation. A write-read-gap (WRG) set pattern of a write memory access operation followed by a read memory access operation and then followed by a set gap when no memory access operation may be undertaken, meets the particular requirements of RDRAM. Within the WRG pattern, read addresses and write addresses are selected to minimize memory bank access conflicts. Such selections are assisted in increasing the efficiency of the memory access operations by defining a set frame size of a specific number of repetitions of the WRG pattern. All memory access operations are then rearranged to conform to the WRG pattern and, the repetitions of the WRG pattern are divided into frames having a size equal to that of the defined frame size. Within each frame, the read addresses to be accessed by read memory operations can be rearranged to minimize memory bank access conflicts with either write addresses to be accessed by write memory operations or other read addresses.

In a first aspect, the present invention seeks to provide a method of increasing the efficiency of memory access operations to a memory subsystem having multiple memory banks, the method comprising arranging memory access operations to the memory banks such that the memory access operations follow a predetermined repeating pattern, the repeating pattern comprising a write memory access operation followed by read memory access operation, each repetition of the repeating pattern being followed by a set time gap of during which no memory access operation may be undertaken, the set time gap being a fixed, predetermined amount of time.

In a second aspect the present invention provides a method of selecting a write address for a write memory access operation to avoid possible memory bank contention between successive memory access operation the method comprising selecting a write address based on the following criteria:

a) if a proximate read memory access operation is executed within a predetermined number of memory access operations from the write memory access operation, the write memory access operation accesses a group of memory banks different from a group of memory banks accessed by the proximate read memory access operation;

b) the write address accesses a memory bank chosen from a pool of memory banks, the pool excluding any of the following:

b1) memory banks accessed by an immediately preceding read memory access operation;
b2) memory banks to be accessed by an immediately succeeding read memory access operation;
b3) memory banks accessed by an immediately preceding write memory access operation; and
b4) memory banks immediately adjacent memory banks referred to in b1), b2) and b3);

c) the write memory access operation accesses a memory bank that is a least full memory bank in the pool of memory banks.

In a second aspect the present invention provides a method of increasing an efficiency of read memory access operations by avoiding possible memory bank contention between read memory access operations, the method comprising:

a) arranging memory access operations to the memory banks such that the memory access operation follow a predetermined repeating pattern, the repeating pattern comprising a write memory access operating followed by read memory access operation, each repetition of the repeating gap pattern being followed by fixed predetermined time interval during which no memory access operation may be undertaken;

b) defining a frame size of a predetermined fixed size, the frame size comprising a fixed number of repetitions of the repeating pattern;

c) dividing all memory access operations into frames having the frame size defined in step b);

d) dividing each frame into windows having a window size, each window having a first overlap of a least one instance of the repeating pattern with a preceding window and each window having a second overlap of at least one instance of the repeating pattern with a succeeding window; and e) rearranging read memory access operations within each window such that memory addresses involved in the read memory access operations do not have bank conflicts with each other.

DESCRIPTION OF THE DRAWINGS

A better understanding of the invention will be obtained by a consideration of the detailed description below, in conjunction with the following drawings, in which.

DETAILED DESCRIPTION

Figure 1:
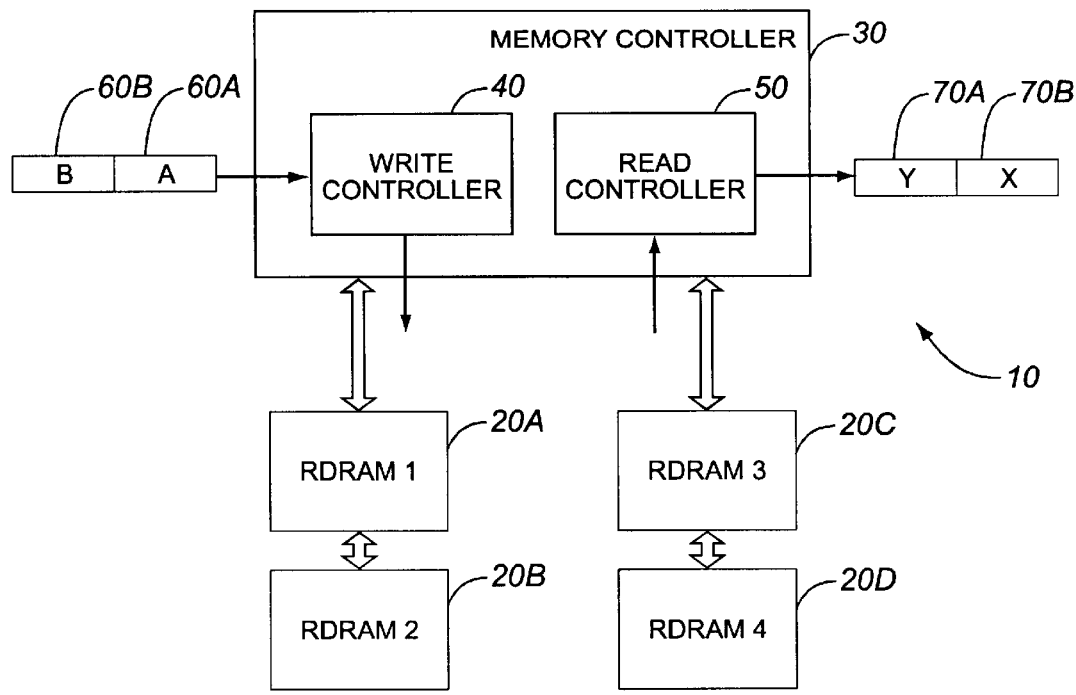
FIG. 1 is a block diagram of a memory system for networking applications.

Referring first to FIG. 1, a block diagram of memory system 10 for networking applications using RDRAM modules 20A, 20B, 20C, 20D is illustrated. The memory system 10 has a memory controller 30 within which resides a write controller 40 and a read controller 50.

The system 10 works as follows. Data segments 60A, 60B with a fixed size are received by the memory controller 30 for buffering. These segments 60A and 60B, are data transmission units that encapsulate data for transfer between two points. After the segments 60A and 60B are received, the write controller 40 stores them by writing them in one or more of the RDRAM modules 20A, 20B, 20C, 20D. Each RDRAM module 20A, 20B, 20C, 20D has multiple memory banks and it is in these memory banks that the segments 60A, 60B are stored.

When buffered segments are to be retrieved, read controller 50 reads the buffered segments from the RDRAM modules 20A, 20B, 20C, 20D and transmits these retrieved segments as fixed size segments 70A, 70B.

One issue with RDRAM modules is that, as noted above, sense amplifiers are shared between memory banks. These sense amplifiers are the route by which data is written to and retrieved from rows and columns within a memory bank. Because of the shared sense amplifiers and other factors, a memory bank has to undergo a transition between a read access memory operation and a write access memory operation (read-to-write transition). Thus, there is a period of time, albeit small, during which no memory operation may be performed on the memory bank.

Another issue with RDRAM modules is, again, caused by the shared sense amplifiers. A write-to-read transition, that is a transition between a write memory access operation to a read memory access operation, prevents a read operation from being executed on the same RDRAM module as the last write operation during the transition.

A third problem arises due to row access times of a memory bank. Once a memory bank is accessed, no other rows in that bank or any banks adjacent to the accessed bank, may be accessed for a specific time interval (referred to as a "gap"). Thus, during this interval, the accessed bank along with any adjacent banks, is unavailable for memory operations.

To partially overcome the above problems, all memory operations for the memory controller 30 follow a set, repeating pattern. This pattern is that of a write memory access operation followed by a read memory access operation, and, finally a short period during which no operations are executed. This gap period is inserted to account for the read-to-write transition. Thus, a WRG (write-read-gap) pattern can be repeated as required.

The WRG pattern accounts for the read to write transition with the time gap in the pattern and the write to read transition problem can be accounted for by having two RDRAM modules on the same databus to the memory controller. This way, when one RDRAM module is unavailable due to the write to read transition, the other RDRAM module can be accessed.

Figure 2:
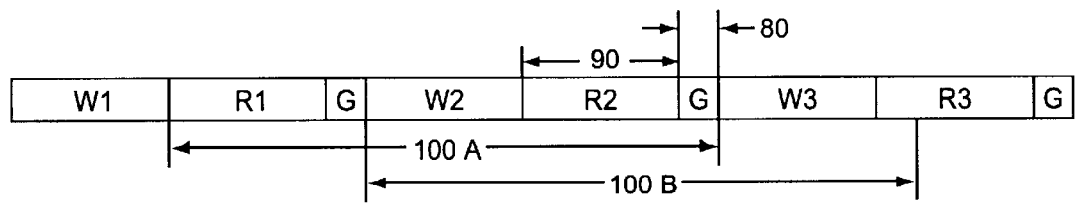
FIG. 2 is a schematic timing diagram illustrating a memory operation pattern according to the invention.

The third problem is more difficult to overcome due to the shared sense amplifiers. To further illustrate the issue, FIG. 2 illustrates a schematic timing diagram of the WRG pattern and the transitions involved. In FIG. 2, time interval 80 is the time gap inserted in the WRG pattern to account for the read-to-write transitions. Time interval 90 is the time interval during which an RDRAM module cannot be accessed due to a write-to-read transition. As noted above, this can be overcome by having two RDRAM modules as the same databus. Time intervals 100A, 100B are the time intervals during which a memory bank and memory banks adjacent to it, cannot be accessed due to row access times. As can be seen in FIG. 2 during the time interval 100A due to write operation W1, read operations R1 and R2 and write operations W2 cannot access memory banks adjacent to or the same as the memory bank accessed by write operation W1. Similarly, with reference to time interval 100B, read operation R1 constrains the memory banks on which write operations W2 and W3 and read operation R2 can be performed. It must be noted that time intervals 100A and 100B are separately provided only for illustration purposes. It must also be noted that the WRG pattern in FIG. 2 can be optimized for transferring blocks of 32 bytes of data to and from an RDRAM memory subsystem.

To account for the conflicts explained above, read and write addresses can be selected to minimize such conflicts. This can be done because in networking applications memory controllers usually have full freedom in selecting write addresses. However, read addresses are usually predetermined by other factors that are beyond the control of memory controllers.

Given the above constraints, predetermined read addresses that conflict with a previously accessed read address can be handled by merely delaying, for one WRG block, the read operation which uses these predetermined addresses. This means that a NOP (no operation) is inserted in the read section of the WRG block containing the read operation which uses the conflicting read address. As an example, if the read operation in WRG block A accesses memory bank BK, and if the read operation in WRG block B which immediately succeeds WRG block A, similarly accesses memory bank BK, then there is a bank conflict. To avoid the conflict, a NOP is inserted in WRG block B in place of its read operation. This now displaced read operation is then passed on to WRG block C. If WRG block C immediately succeeds WRG block B, then the displaced read operation is thereby delayed by one WRG block or one repetition or the WRG pattern. By delaying the displaced read operation by one WRG block, the bank conflict is avoided.

With regard to write addresses, because the memory controller can choose write addresses, more options for avoiding bank conflicts are available. The criteria for selecting write addresses can be the following:

a) For each read operation accessing a read address in a WRG block, the write address chosen for the write operation must be in a different RDRAM module than the read address. Thus, if, in a specific WRG block, a read operation accesses RDRAM module R1, then the write operation in the same WRG block must choose a write address located in RDRAM module other than RDRAM module R1.

b) The selected memory to be accessed by a selected write address must not be the same bank accessed by an immediately preceding write operation. Furthermore, this selected memory bank accessed by the selected write address must not be a memory bank which will be accessed by an immediately succeeding read operation. Also, this selected memory bank cannot be a memory bank immediately adjacent a memory bank that has been accessed by an immediately preceding write operation. Lastly, the selected memory bank cannot be adjacent to a memory bank that is to be accessed by an immediately succeeding read operation.

Based on the above, if a number of memory banks are arranged, in order, as:

| A | B | C | D | E | then bank B is adjacent to both banks A and C. Similarly, banks C and E are adjacent to bank D. However, bank B is not adjacent to bank D. From this configuration, if a read operation accesses bank B, then the immediately preceding write operation and the immediately succeeding write operation cannot select write addresses contained in any of banks A, B, or C. From the explanation in a) above, if the immediately preceding write operation was in the same WRG block as the read operation, then that immediately preceding write operation would have to select a write address that is in a different RDRAM module. This removes the problem of bank conflict. The immediately succeeding write operation can then choose a write address contained in either of banks D or E as these are neither adjacent to nor the same as the bank accessed by immediately preceding read operation.

It should be noted that, since read addresses are predetermined, it is a simple matter to determine an immediately succeeding read address for the above process.

The final criteria to be used in selecting a write address relates less to bank conflicts and more to the efficient use of resources. After the two criteria listed above have been met for selecting a bank for a write address, the remaining write address candidates must pass a final test. The selected write address must be in a memory bank that has the most space available for data. In other words, the least full memory bank that conforms to the two criteria above must be the selected bank.

When using the criteria above, it has been found that the write efficiency increases. Using 128 Mbit RDRAM modules with a 16-dependent bank structure, write addresses, selected using the above criteria are not blocked by bank conflicts until occupancy of the modules approaches 100%.

Another benefit of the above criteria is that delay between memory operations is decreased. Since write operations are constrained by future read operations, because the write address required for the write operation is dependent on the read address for the read operation, the actual write address to the RDRAM module cannot be determined until the next read request arrives from outside the memory controller. There is, therefore, less delay between operations as the required addresses are supplied to the operations at roughly the same time.

While the above method selects the write address and thereby increases the writing efficiency of the system, read efficiency is not affected. To improve the read efficiency, the memory controller must be allowed to select read addresses. One method of doing this which allows the memory controller independence from the read address selection process is to reorder the read operations. In doing so bank conflicts between read addresses can be reduced by moving conflicting read addresses so that the read operations using these read addresses are not temporally adjacent one another.

To implement the reordering of read operations a frame size of M read operations is defined among the repetitions of the WRG pattern. The memory controller can then reorder read operations within the given frame size of M operations. Since this leads to M! possible orderings of read operations, the computational complexity of the system increases significantly as M increases. It must be noted that a frame size of M read operations encompasses M repetitions of the WRG pattern.

Figure 3:
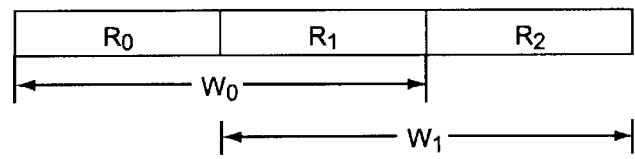
FIG. 3 is a simplified schematic diagram of three read operations.

The problematical computational complexity can be controlled by defining a window size W reads operations within the frame of size M. A frame is then divided into window sections of size W read operations with each window section overlapping its immediately preceding and immediately succeeding window sections. The memory controller is only allowed to reorder read operations within a given window section. To illustrate this, FIG. 3 presents a schematic diagram of three read operations, $R_0$, $R_1$, $R_2$ with two window sections $W_0$, $W_1$ overlapping the read operation $R_1$. Clearly the window size in this example is 2 while the overlap interval is 1 read operation. From this Figure, the memory controller can thus reorder read operations $R_0$ and $R_1$ as these are both in window section $W0$. Similarly, read operations $R_1$, $R_2$ can be reordered as they are both in window section $W_1$. To continue with the example, if it is assumed that read operation $R_0$ is to continue to avoid a conflict with a preceding read operation, and if read operation $R_1$ conflicts with read operation $R_0$, then read operations $R_1$ and $R_2$ can be reordered in window section $W_1$ to remove this conflict between read operations $R_0$ and $R_1$.

Figure 4:
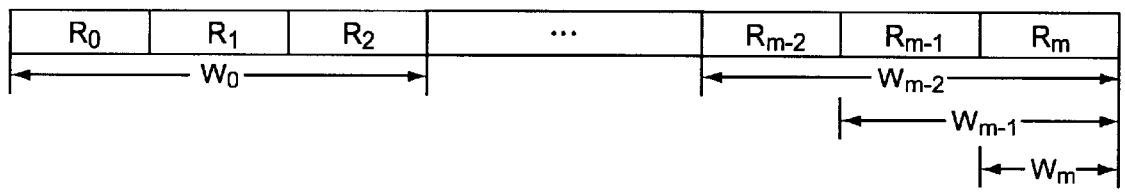
FIG. 4 is a simplified schematic diagram illustrating the concept of decreasing window sizes according to the invention.

One possible issue with the above is the unbounded nature of the reordering. A read operation may, theoretically, be shuffled indefinitely and thereby avoid being executed. To prevent this, an absolute frame size M is imposed. Window sections are not allowed to extend beyond the boundaries of the absolute frame size. This is illustrated in FIG. 4 where window sections $W_{m-2}$, $W_{m-1}$, $W_m$ decrease in size as one gets closer to the bounds of frame size M. In such a scheme, the last window section will always have a size equal to that of one read operation.

It should be noted that each read operation in FIGS. 3 and 4 are understood to be part of a larger, repeating WRG pattern. However, to simplify the Figures, only the read operations were illustrated.

We claim:

1. A method of increasing the efficiency of memory access operations to a memory subsystem having multiple memory banks, the method comprising arranging memory access operations to the memory banks such that the memory access operations follow a predetermined repeating pattern, the repeating pattern comprising a write memory access operation followed by a read memory access operation, each repetition of the repeating pattern being followed by a set time gap during which no memory access operation may be undertaken, the set time gap being a fixed, predetermined amount of time.

2. A method as in claim 1 wherein if a first memory address for a previous read memory access operation prevents a current read memory access operation for a second memory address because of a conflict between the first memory address and the second memory address, the current read memory access operation on the second memory address is delayed for one instance of the repeating pattern.

3. A method as in claim 1 wherein for each write memory access operation, a write address is selected based on the following conditions:
   a) if a proximate read memory access operation was executed within a predetermined number of memory access operations from the write memory access operation, the write memory access operation accesses a group of memory banks different from a group of memory banks accessed by the proximate read memory access operation;
   b) the write address accesses a memory bank chosen from a pool of memory banks, the pool excluding any of the following:
      b1) memory banks accessed by an immediately preceding read memory access operation;
      b2) memory banks to be accessed by an immediately succeeding read memory access operation;
      b3) memory banks accessed by an immediately preceding write memory access operation; and
      b4) memory banks immediately adjacent memory banks referred to in b1), b2) and b3);
   c) the write address accesses a memory bank that is the least full memory bank in the pool.

4. A method of selecting a write address for a write memory access operation to avoid possible memory bank contention between successive memory access operation, the method comprising selecting a write address based on the following criteria:
   a) if a proximate read memory access operation is executed within a predetermined number of memory access operations from the write memory access operation, the write memory access operation accesses a group of memory banks different from a group of memory banks accessed by the proximate read memory access operation;
   b) the write address accesses a memory bank chosen from a pool of memory banks, the pool excluding any of the following:
      b1) memory banks accessed by an immediately preceding read memory access operation;
      b2) memory banks to be accessed by an immediately succeeding read memory access operation;
      b3) memory banks accessed by an immediately preceding write memory access operation; and
      b4) memory banks immediately adjacent memory banks referred to in b1), b2) and b3);
   c) the write memory access operation accesses a memory bank that is a least full memory bank in the pool of memory banks.

5. A method of increasing an efficiency of read memory access operations by avoiding possible memory bank contention between read memory access operations, the method comprising:
   a) arranging memory access operations to the memory banks such that the memory access operation follow a predetermined repeating pattern, the repeating pattern comprising a write memory access operation followed by a read memory access operation, each repetition of the repeating gap pattern being followed by a fixed predetermined time interval during which no memory access operation may be undertaken;
   b) defining a frame size of a predetermined fixed size, the frame size comprising a fixed number of repetitions of the repeating pattern;
   c) dividing all memory access operations into frames having the frame size defined in step b);
   d) dividing each frame into windows having a window size, each window having a first overlap of a least one instance of the repeating pattern with a preceding window and each window having a second overlap of at least one instance of the repeating pattern with a succeeding window; and
   e) rearranging read memory access operations within each window such that memory addresses involved in the read memory access operations do not have bank conflicts with each other.

6. A method as in claim 5 wherein the window size is adjustable.

* * * * *